(12) United States Patent
Andideh

(10) Patent No.: US 6,506,692 B2
(45) Date of Patent: Jan. 14, 2003

(54) METHOD OF MAKING A SEMICONDUCTOR DEVICE USING A SILICON CARBIDE HARD MASK

(75) Inventor: Ebrahim Andideh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/871,546

(22) Filed: May 30, 2001

(65) Prior Publication Data

US 2002/0182894 A1 Dec. 5, 2002

(51) Int. Cl.⁷ ............................................. H01L 21/26
(52) U.S. Cl. ...................... 438/796; 438/634; 438/931
(58) Field of Search ...................... 438/796, DIG. 931, 438/634, 618

(56) References Cited

U.S. PATENT DOCUMENTS

| 4,587,138 A | 5/1986 | Yau et al. |
| 4,910,122 A | 3/1990 | Arnold et al. |
| 5,892,096 A | 4/1999 | Meador et al. |
| 6,033,977 A | 3/2000 | Gutsche et al. |
| 6,037,255 A | 3/2000 | Hussein et al. |
| 6,057,239 A | 5/2000 | Wang et al. |
| 6,228,159 B1 * | 5/2001 | Gregg et al. ........... 106/287.14 |
| 6,365,527 B1 * | 4/2002 | Yang et al. ................. 528/196 |

OTHER PUBLICATIONS

Roderick R. Kunz et al., "Materials Evaluation of Antireflective Coatings for Single Layer 193–nm Lithography" Advances in Resist Technology and Processing XI, Proceedings SPIE–The International Society for Optical Engineering, Feb. 1994, vol. 2195, pp. 447–460, San Jose, CA.

* cited by examiner

Primary Examiner—John F. Niebling
Assistant Examiner—Jennifer M. Kennedy
(74) Attorney, Agent, or Firm—Mark V. Seeley

(57) ABSTRACT

A method of converting a hydrophobic surface of a silicon carbide layer to a hydrophilic surface is described. That method comprises forming a silicon carbide containing layer on a substrate, then operating a PECVD reactor to generate a plasma that converts the surface of that layer from a hydrophobic surface to a hydrophilic surface. Also described is a method for making a semiconductor device that employs this technique.

6 Claims, 7 Drawing Sheets

METHOD OF MAKING A SEMICONDUCTOR DEVICE USING A SILICON CARBIDE HARD MASK

FIELD OF THE INVENTION

The present invention relates to a method of making semiconductor devices using a silicon carbide hard mask.

BACKGROUND OF THE INVENTION

Semiconductor devices include metal layers that are insulated from each other by dielectric layers. As device features shrink, reducing the distance between the metal layers and between metal lines on each layer, capacitance increases. To address this problem, insulating materials that have a relatively low dielectric constant are being used in place of silicon dioxide to form the dielectric layer that separates the metal lines.

Certain materials that may be used to form low k dielectric layers (e.g., those comprising organic polymers) must be protected, when certain processes are used to remove photoresist, or other substances, from their surfaces. In a commonly used technique to protect such materials, a hard mask is formed on their surface prior to depositing photoresist, or other substances, on top of them. Such a hard mask may be formed from silicon carbide. Although silicon carbide may adequately protect an underlying dielectric layer during subsequent process steps, this class of materials is hydrophobic. Silicon carbide's hydrophobic nature renders it difficult to clean its surface, and to bond it to other layers. In addition, materials that are coated onto silicon carbide may lack desirable thickness uniformity.

Current methods for addressing silicon carbide's undesirable attributes employ adhesion promoters and certain chemical solutions, which modify surface chemistry to facilitate surface cleaning. Such methods require the use of relatively expensive chemicals. Accordingly, there is a need for an improved process for making a semiconductor device using a silicon carbide hard mask. There is a need for such a process that converts a hydrophobic silicon carbide surface to a hydrophilic one in a relatively inexpensive and unobtrusive manner, enabling improved adhesion characteristics and facilitating surface cleaning. The method of the present invention provides such a process.

DETAILED DESCRIPTION OF THE PRESENT INVENTION

A method is described for converting a hydrophobic surface of a silicon carbide layer to a hydrophilic surface. That method comprises forming a silicon carbide containing layer on a substrate, then operating a plasma enhanced chemical vapor deposition ("PECVD") reactor to generate a plasma that converts the surface of that layer from a hydrophobic surface to a hydrophilic surface. In a preferred embodiment of the present invention, the reactor is first operated to form the silicon carbide containing layer on the substrate. It is then operated to generate the plasma that converts the surface of that layer from a hydrophobic surface to a hydrophilic surface while the substrate remains in situ inside the reactor.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
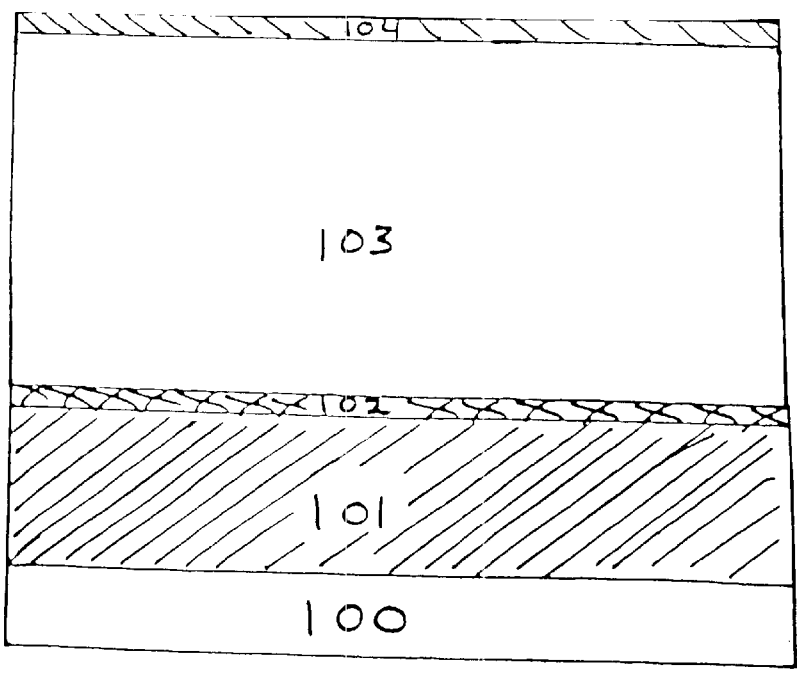
FIGS. 1a–1d represent cross-sections of structures that may result after certain steps are used to make a semiconductor device in a process that may benefit from application of the method of the present invention.

The method of the present invention may be used in many contexts. For example, this method may be used when making a semiconductor device, e.g., being applied to convert a hydrophobic surface of a silicon carbide hard mask into a hydrophilic surface—which can better adhere to materials that are coated onto it and which can be more easily cleaned. FIGS. 1a–1d represent cross-sections of structures that may be formed when making a semiconductor device using the method of the present invention. FIG. 1a represents a structure that includes substrate 100 upon which is formed a first conductive layer 101. First conductive layer 101 is covered by barrier layer 102, which in turn is covered by dielectric layer 103. Hard masking layer 104 covers dielectric layer 103.

Substrate 100 may be any surface, generated when making an integrated circuit, upon which a conductive layer may be formed. Substrate 100 may include, for example, active and passive devices that are formed on a silicon wafer such as transistors, capacitors, resistors, diffused junctions, gate electrodes, local interconnects, etc . . . Substrate 100 also may include insulating materials that separate such active and passive devices from the conductive layer or layers that are formed on top of them, and may include previously formed conductive layers.

Conductive layer 101 may be made from materials conventionally used to form conductive layers for semiconductor devices. Barrier layer 102 serves to prevent an unacceptable amount of the material included in conductive layer 101 from diffusing into dielectric layer 103. Barrier layer 102 also acts as an etch stop to prevent a subsequent via etch step from exposing conductive layer 101 to subsequent cleaning steps. Barrier layer 102 preferably is made from silicon nitride or silicon carbide, but may be made from other materials that can serve such functions, as is well known to those skilled in the art.

In this embodiment, dielectric layer 103 comprises a low-k material, e.g., a material with a dielectric constant less than about 3.0, which must be protected when photoresist—to be coated on top of it—is removed. Dielectric layer 103 may, for example, comprise SiOF or an organic polymer— such as a polyimide, parylene, polyarylether, polynaphthalene, or polyquinoline. Commercially available polymers sold by Honeywell, Inc., under the trade name FLARE™, and by the Dow Chemical Company, under the trade name SiLK™, may be used to form dielectric layer 103. Hard masking layer 104 is formed on dielectric layer 103 in the conventional manner and comprises silicon carbide. In addition to silicon carbide, layer 104 may include some hydrogen—depending upon how layer 104 is made.

The structure shown in FIG. 1a may be generated using conventional process steps, as will be apparent to those of ordinary skill in the art.

Figure 2:
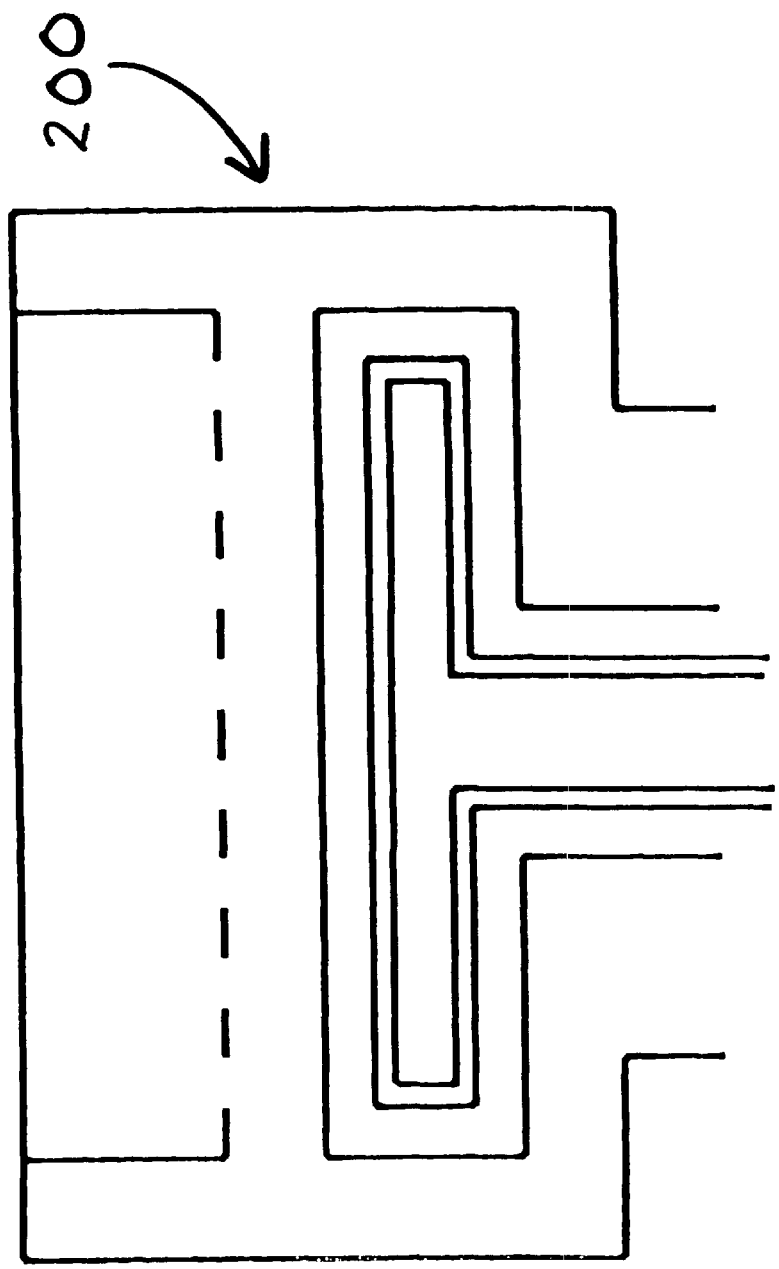
FIG. 2 provides a schematic representation of a CVD chamber for a PECVD reactor.

Because the surface of silicon carbide hard masking layer 104 is hydrophobic, it has poor adhesion qualities and is difficult to clean. By applying the method of the present invention to that surface, however, it may be converted to a hydrophilic surface that may bond better to photoresist and be easier to clean. In that method, the structure shown in FIG. 1a may be formed in a PECVD reactor, e.g., PECVD reactor 200 illustrated in FIG. 2. While the FIG. 1a structure remains in situ inside the reactor, that reactor is then operated to generate a plasma that converts the surface of silicon carbide hard masking layer 104 from a hydrophobic surface to a hydrophilic surface. Although preferably retaining the wafer in situ inside the reactor when forming the silicon carbide layer and converting its surface to a hydrophilic surface, those skilled in the art will appreciate that these steps can be performed separately, e.g., by first forming silicon carbide containing layer 104 on dielectric layer 103, then placing the resulting structure into a PECVD reactor to convert its surface to a hydrophilic surface.

To generate the plasma that converts the surface of layer 104 to a hydrophilic surface, a gas that is selected from the group consisting of oxygen, nitrogen, argon, hydrogen, xenon, krypton, nitrous oxide, carbon monoxide, and carbon dioxide may be introduced into reactor 200 in the conventional manner. Alternatively, a mixture of helium and one of these gases may be introduced into reactor 200, or two or more of these gases (with or without helium) may be fed into the reactor. This gas, or gases, may be introduced into reactor 200 at conventional temperatures and pressures. Optimal operating conditions may, of course, depend upon the composition of the gas streams fed into the reactor, the type of reactor used, and the desired properties for the surface of silicon carbide hard masking layer 104. In a preferred embodiment, a plasma is then struck at RF power of between about 100 and about 3,000 watts. Any commercially viable frequency, e.g., 13.56 MHz, 27 MHz, microwave frequencies, etc . . . , may be used to generate the plasma. The surface of layer 104 is preferably exposed to that plasma for at least about 0.5 seconds and for less than about 20 seconds.

Exposing silicon carbide hard masking layer 104 to such a plasma can convert its surface from a hydrophobic surface to a hydrophilic one. The depth of that modified surface can be controlled by changing the RF power, reactor pressure, gas stream composition, susceptor temperature, and/or exposure duration. Optimal operating conditions and gas stream makeup will depend upon the desired properties for the surface of layer 104.

Figure 1B:
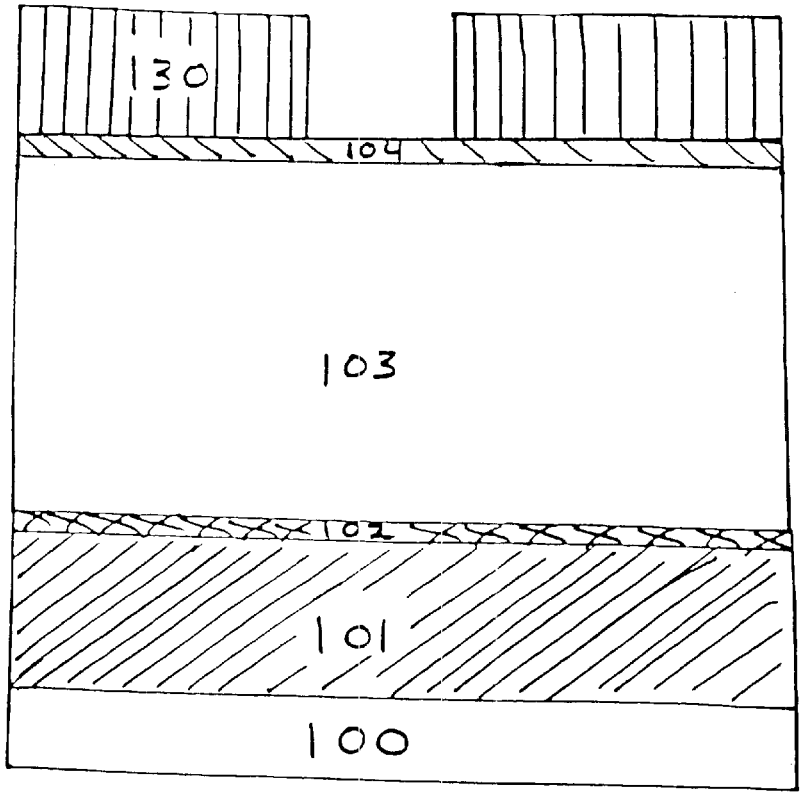
Figure 1C:
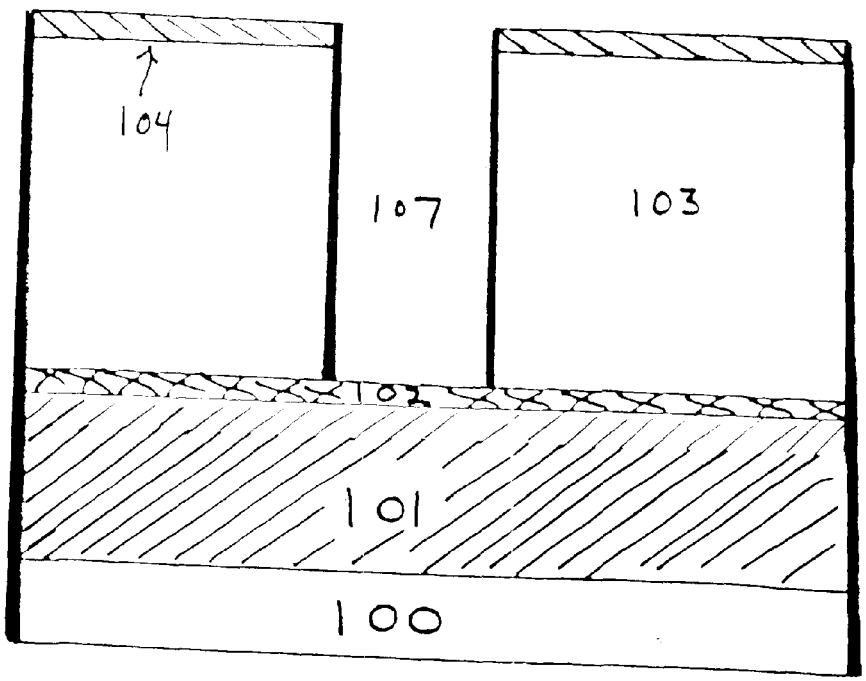
Figure 1D:
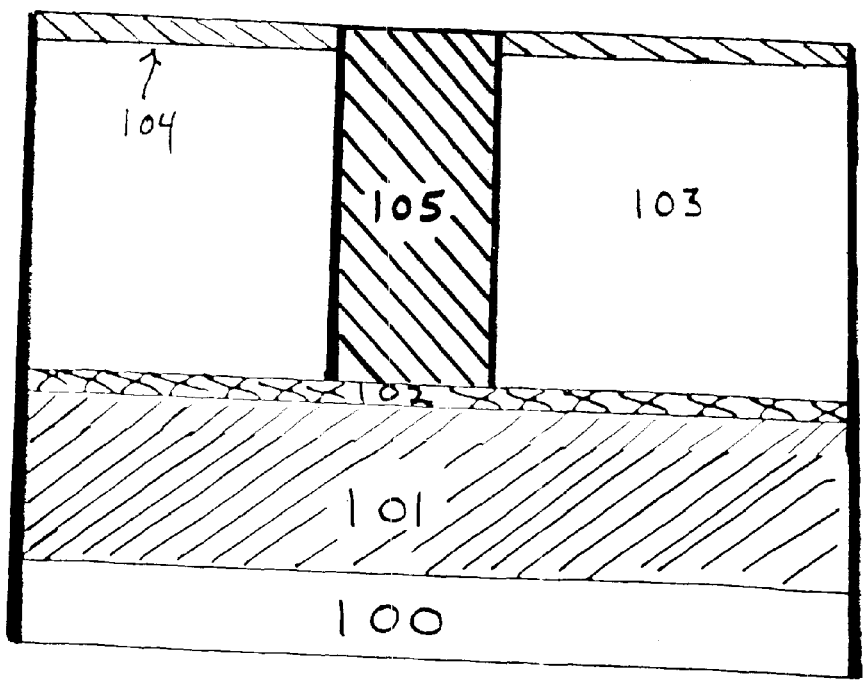

After converting the surface of silicon carbide hard masking layer 104 to a hydrophilic surface, photoresist layer 130 may be deposited onto it, and patterned, to generate the structure represented by FIG. 1b. Because of the hydrophilic nature of the surface of layer 104, photoresist layer 130 may bond to that surface in a satisfactory manner—without requiring the use of an adhesion promoter. Via 107 may then be etched, followed by removing the photoresist, generating the structure shown in FIG. 1c. At this stage of the process, via 107 and the surface of silicon carbide hard masking layer 104 must be cleaned. Because the surface of layer 104 is now hydrophilic, it may be cleaned in the conventional manner, without first requiring its surface chemistry to be modified with wet chemicals. Following that cleaning step, conventional process steps are used to remove part of barrier layer 102 and to fill via 107 with a conductive material. A chemical mechanical polishing ("CMP") step may then be applied to remove excess material to form second conductive layer 105, creating the FIG. 1d structure. Although FIG. 1d illustrates a structure that retains hard masking layer 104, if desired, that layer may be removed during that CMP step.

Figure 3A:
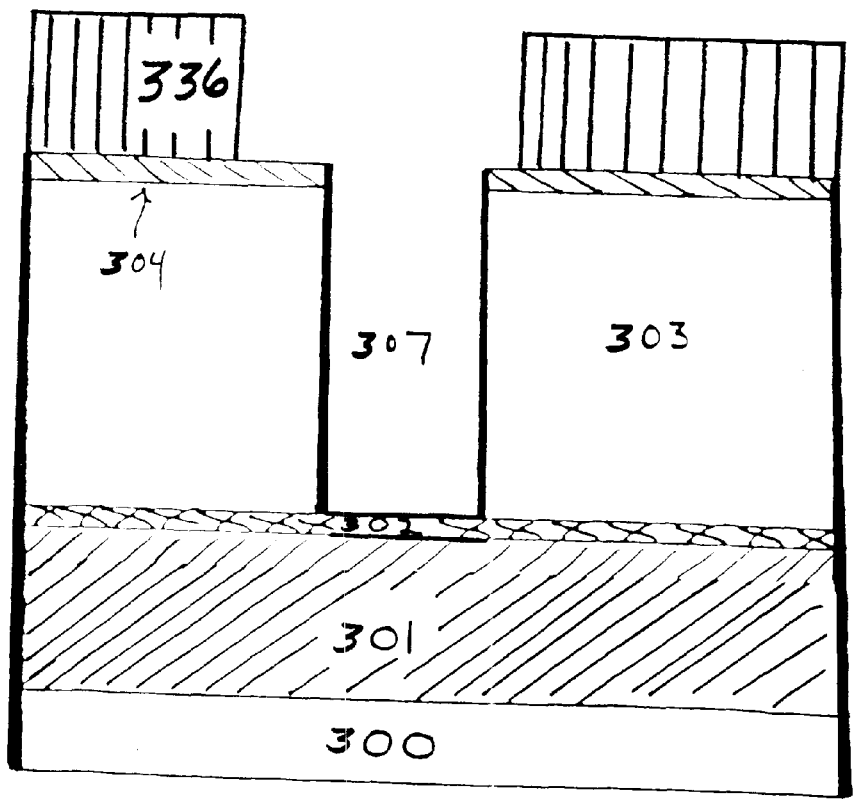
FIGS. 3a–3c represent cross-sections of structures that may result after certain steps are used to make a semiconductor device in a second process that may benefit from application of the method of the present invention.
Figure 3B:
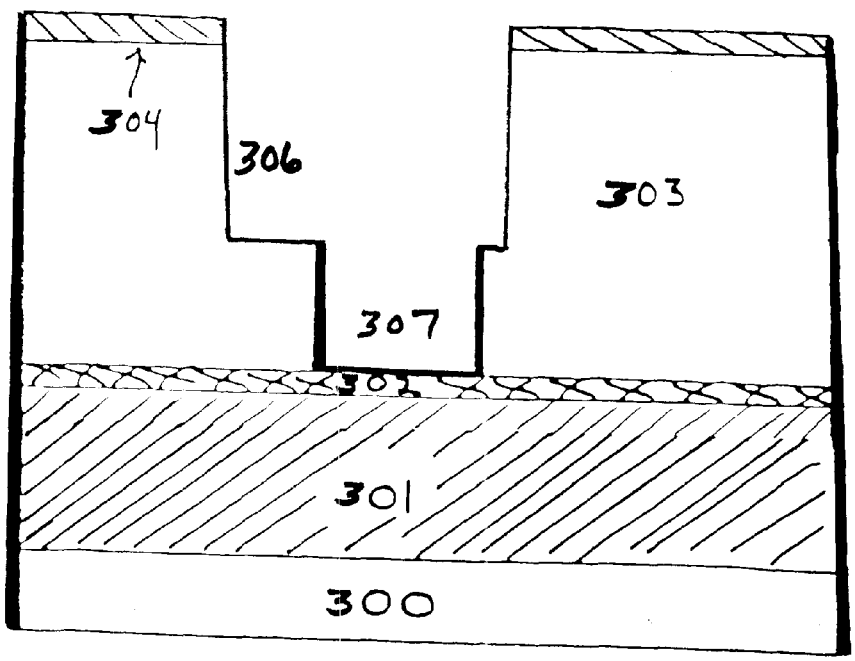
Figure 3C:
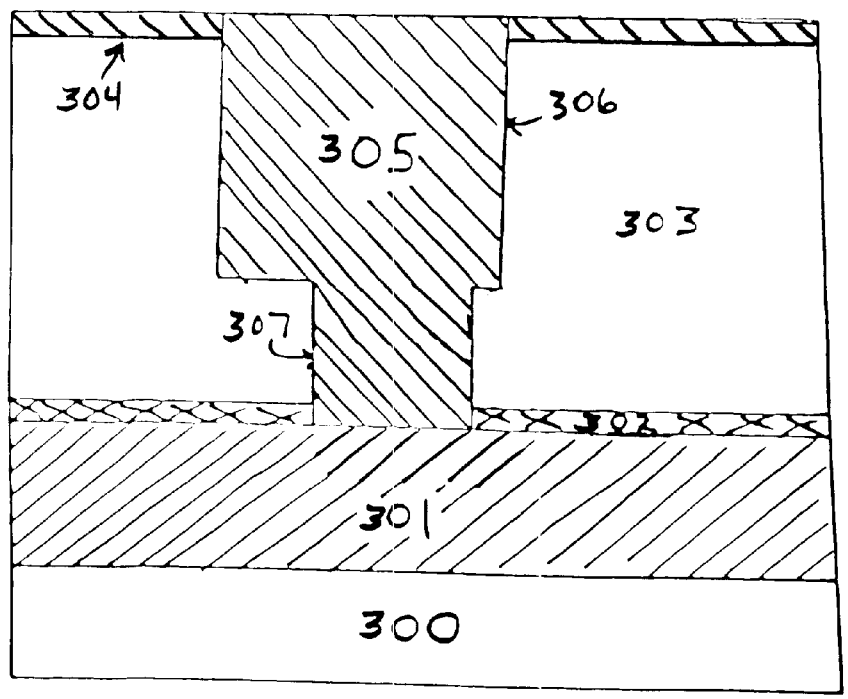

The method of the present invention may be applied to other processes for forming semiconductor devices. FIGS. 3a–3c represent structures that may be formed when making a semiconductor device that includes a dual damascene interconnect. To make such a device, a second layer of photoresist is deposited onto the structure shown in FIG. 1c, then patterned to produce photoresist layer 336, which defines the trench that will be etched into dielectric layer 303. FIG. 3a represents the resulting structure. When the surface of silicon carbide hard masking layer 304 has been previously converted to a hydrophilic surface, using the technique described above, photoresist layer 336 will bond to hard masking layer 304 in an acceptable fashion.

After forming photoresist layer 336, trench 306 may be etched into dielectric layer 303, as shown in FIG. 3b. Trench 306, via 307, and the surface of silicon carbide hard masking layer 304 are then cleaned. Because that surface has been converted into a hydrophilic surface, it may be adequately cleaned using standard cleaning steps. Part of barrier layer 302 is then removed, followed by filling trench 306 and via 307 with a conductive material, then applying a CMP step to remove excess material to form conductive layer 305—generating the FIG. 3c structure. Although this figure shows retention of hard masking layer 304, it may be removed—if desired.

Still another process for making a semiconductor device, which may benefit from use of the method of the present invention, is illustrated in FIGS. 4a–4e. In that process, via 407 is filled with sacrificial light absorbing material ("SLAM") 408 to create the structure shown in FIG. 4a. That SLAM may comprise a dyed spin-on-polymer ("SOP") or dyed spin-on-glass ("SOG") that has dry etch properties similar to those of dielectric layer 403 and light absorbing properties that enable the substrate to absorb light during lithography. SLAM 408 may be spin coated onto the FIG. 1c structure in the conventional manner.

By filling via 407 with SLAM 408, substrate reflection that occurs during trench lithography—which could adversely affect dual damascene via and trench formation—may be reduced or eliminated. In addition, filling via 407 with SLAM 408 may eliminate the need to use etch chemistry to etch the trench that is highly selective to dielectric layer 403 over barrier layer 402, to ensure that the trench etch step will not etch through barrier layer 402. When the surface of silicon carbide hard masking layer 404 has been previously converted to a hydrophilic surface, using the method of the present invention, SLAM 408 will bond to hard masking layer 404 in an acceptable fashion.

Figure 4A:
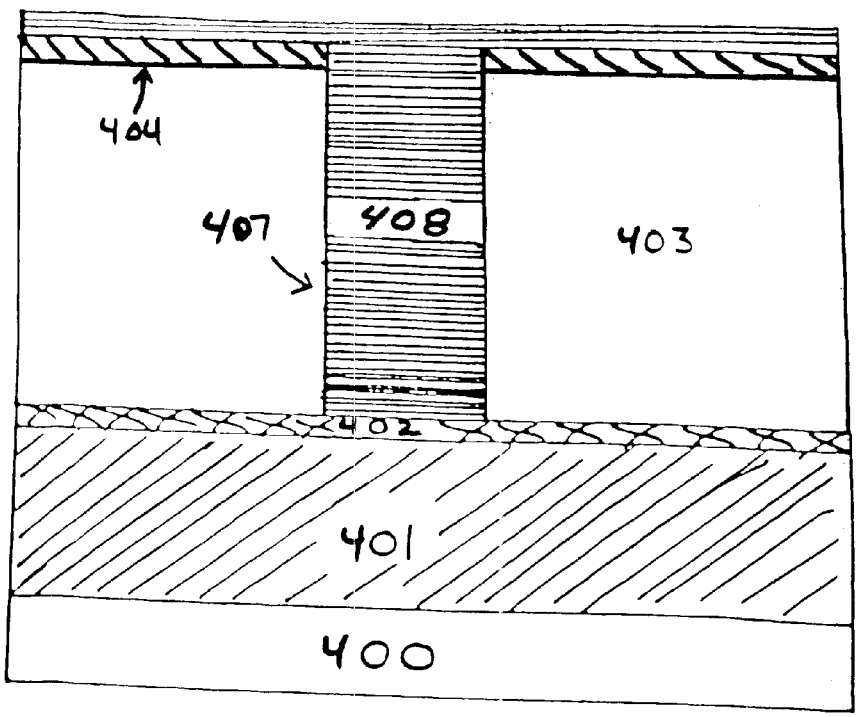
FIGS. 4a–4e represent cross-sections of structures that may result after certain steps are used to make a semiconductor device in a third process that may benefit from application of the method of the present invention.
Figure 4B:
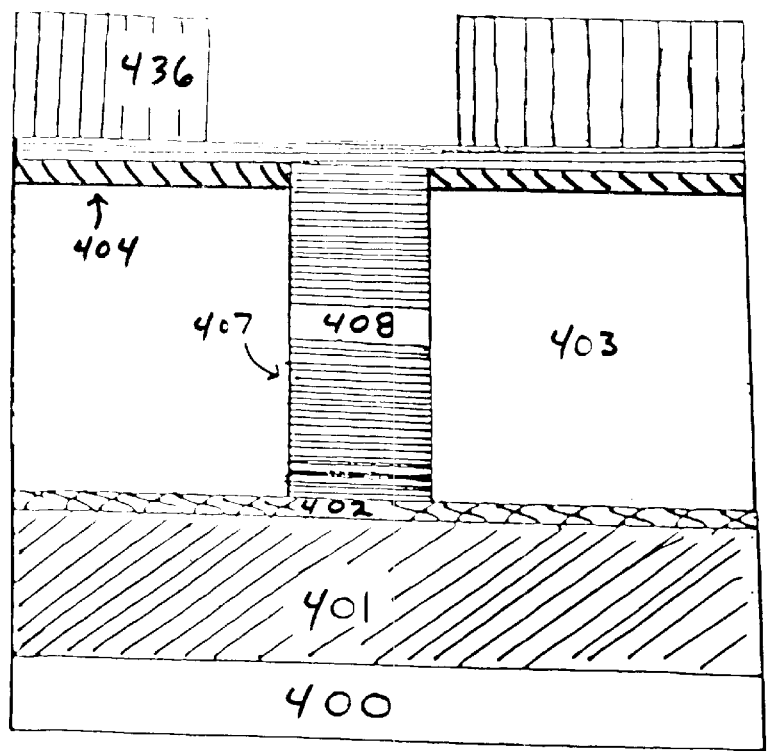
Figure 4C:
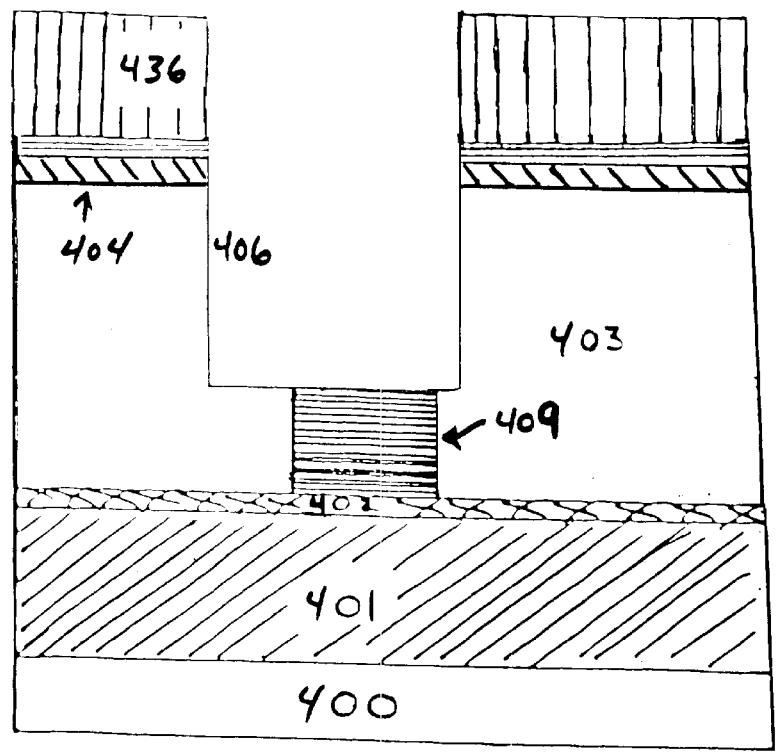
Figure 4D:
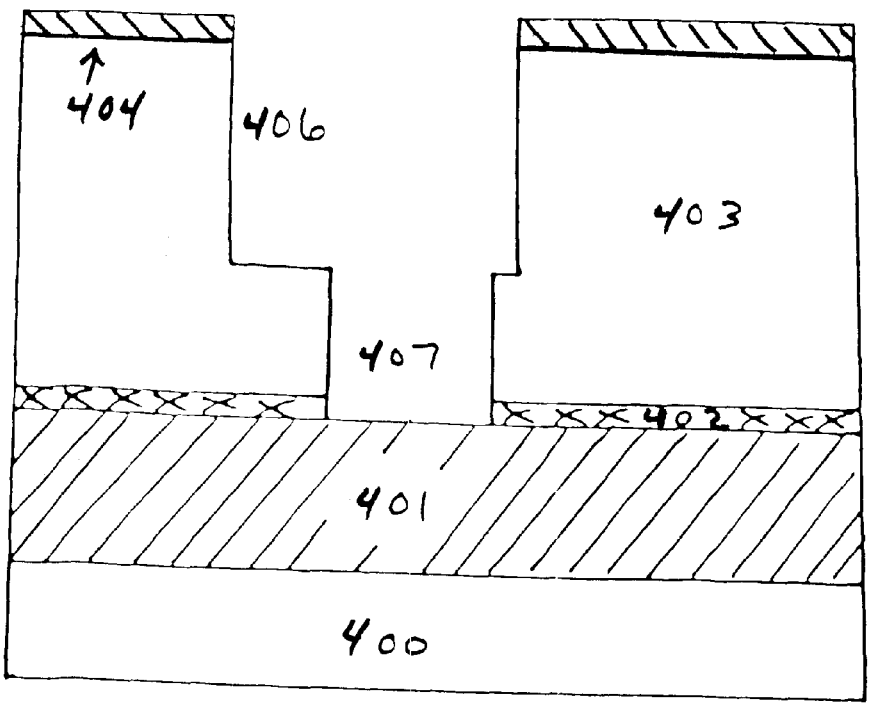
Figure 4E:
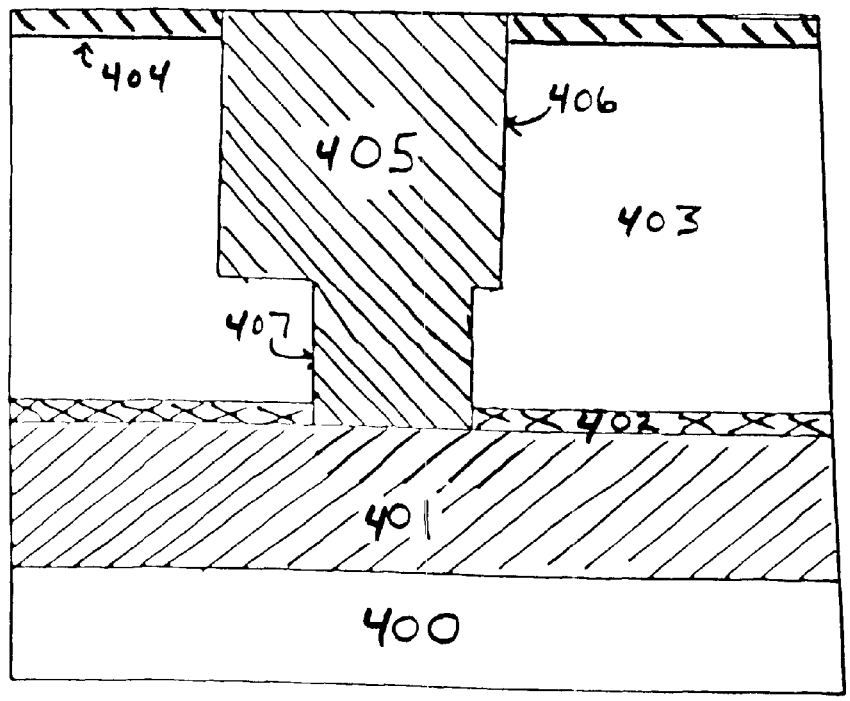

A second layer of photoresist may then be deposited onto SLAM 408, then patterned to produce photoresist layer 436, which defines the trench that will be etched into dielectric layer 403, as shown in FIG. 4b. Trench 406 is then etched into dielectric layer 403 to produce the FIG. 4c structure. Following that trench etch step, the remaining portions of photoresist layer 436 and remaining portions 409 of the SLAM must be removed. Photoresist 436 may be removed using a conventional photoresist ashing process, or, alternatively, by exposing it to a plasma generated from a forming gas—e.g., a gas that includes up to about 5% hydrogen in nitrogen, helium and/or argon.

After removing the photoresist, remaining portions 409 of the SLAM must be removed, along with any residues resulting from the photoresist removal step. Because the surface of silicon carbide hard masking layer 404 has been converted into a hydrophilic surface, the remaining portions of the SLAM may be removed, and via 407 and trench 406 cleaned, using a standard wet etch step. Part of barrier layer 402 may then be removed to generate the structure represented by FIG. 4d. Filling trench 406 and via 407 with a conductive material, then applying a CMP step to remove excess material to form conductive layer 405, generates the FIG. 4e structure. As indicated above, hard masking layer 404 may be removed along with the excess conductive material, if desired.

Figure 5:
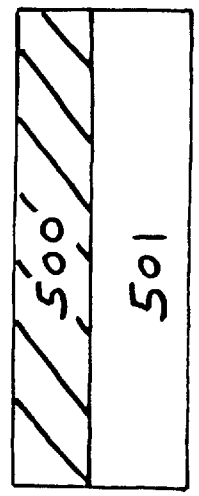
FIG. 5 represents a cross-section of a structure that includes a silicon carbide layer deposited on a substrate, which may benefit from application of the method of the present invention.

The process of the present invention provides a convenient and inexpensive way to convert a hydrophobic surface of a silicon carbide layer into a hydrophilic surface, which can improve that surface's adhesion properties and make it easier to clean. Although the foregoing description has demonstrated how certain processes for making semiconductor devices can benefit from the use of this method, the method of the present invention may be used in many other contexts. In this respect, FIG. 5 represents a cross-section of a structure that includes silicon carbide containing layer 500 deposited on substrate 501. The method of the present invention may be applied to convert a hydrophobic surface of silicon carbide containing layer 500 to a hydrophilic surface, regardless of how substrate 501 is constituted and regardless of the application to which the structure shown in FIG. 5 is employed.

Although the foregoing description has specified certain steps, materials, and equipment that may be used in the above described method for converting a hydrophobic surface of a silicon carbide containing layer to a hydrophilic surface, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of forming a semiconductor device comprising:

forming on a substrate a silicon carbide containing layer;

introducing into a plasma enhanced chemical vapor deposition reactor, which contains the substrate that is covered with the silicon carbide containing layer, a gas that is selected from the group consisting of oxygen, nitrogen, argon, hydrogen, xenon, krypton, nitrous oxide, carbon monoxide, and carbon dioxide;

striking a plasma at RF power of between about 100 and about 3000 watts to convert the surface of the silicon carbide containing layer from a hydrophobic surface to a hydrophilic surface;

depositing a sacrificial light absorbing material, which is selected from the group consisting of a dyed spin-on-glass and a dyed spin-on-polymer, on the surface of the silicon carbide containing layer after the silicon carbide containing layer has been exposed to the plasma; and then depositing a layer of photoresist on the surface of the sacrificial light absorbing material.

2. The method of claim 1 wherein the reactor is first operated to form the silicon carbide containing layer on the substrate, then operated to generate a plasma that converts the surface of that layer from a hydrophobic surface to a hydrophilic surface while the substrate remains in situ inside the reactor.

3. The method of claim 1 wherein the silicon carbide containing layer is exposed to the plasma for between about 0.5 seconds and about 20 seconds.

4. A method of forming a semiconductor device comprising:

forming on a substrate a silicon carbide hard masking layer;

introducing into a plasma enhanced chemical vapor deposition reactor, which contains the substrate that is covered with the silicon carbide hard masking layer, helium and a gas that is selected from the group consisting of oxygen, nitrogen, argon, hydrogen, xenon, krypton, nitrous oxide, carbon monoxide, and carbon dioxide;

striking a plasma at RF power of between about 100 and about 3000 watts to convert the surface of the silicon carbide hard masking layer from a hydrophobic surface to a hydrophilic surface;

depositing a sacrificial light absorbing material, which is selected from the group consisting of a dyed spin-on-glass and dyed spin-on-polymer, on the surface of the silicon carbide hard masking layer after it has been exposed to the plasma; and then depositing a layer of photoresist on the sacrificial light absorbing material.

5. The method of claim 4 wherein the reactor is first operated to form the silicon carbide hard masking layer on the substrate, then operated to generate a plasma that converts the surface of that layer from a hydrophobic surface to a hydrophilic surface while the substrate remains in situ inside the reactor.

6. The method of claim 4 wherein the silicon carbide hard masking layer is exposed to the plasma for between about 0.5 seconds and about 20 seconds.

* * * * *